(12) United States Patent
Weissman et al.

(10) Patent No.: US 10,187,137 B2
(45) Date of Patent: Jan. 22, 2019

(54) HIGH POWER USER EQUIPMENT (HPUE) USING COHERENTLY COMBINED POWER AMPLIFIERS

(71) Applicant: QUALCOMM Incorporated, San Diego, CA (US)

(72) Inventors: Haim Mendel Weissman, Haifa (IL); Sumit Verma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/191,088

(22) Filed: Jun. 23, 2016

(65) Prior Publication Data

US 2017/0294951 A1    Oct. 12, 2017

Related U.S. Application Data

(60) Provisional application No. 62/319,221, filed on Apr. 6, 2016.

(51) Int. Cl.
| | |
|---|---|
| H04B 7/06 | (2006.01) |
| H03F 3/24 | (2006.01) |
| H03F 3/19 | (2006.01) |
| H04B 1/04 | (2006.01) |
| H03F 1/02 | (2006.01) |
| H03F 3/68 | (2006.01) |

(Continued)

(52) U.S. Cl.
CPC ......... *H04B 7/0686* (2013.01); *H03F 1/0277* (2013.01); *H03F 3/19* (2013.01); *H03F 3/245* (2013.01); *H03F 3/68* (2013.01); *H03F 3/72* (2013.01); *H04B 1/0064* (2013.01); *H04B 1/0458* (2013.01); *H04B 1/0475* (2013.01); *H04B 1/0483* (2013.01); *H03F 2200/111* (2013.01); *H03F 2200/451* (2013.01); *H03F 2203/7209* (2013.01)

(58) Field of Classification Search
CPC ....... H04B 1/48; H04B 7/0602; H04B 7/0817
See application file for complete search history.

(56) References Cited

U.S. PATENT DOCUMENTS 6,473,600 B1    10/2002  Dvorkin
7,542,740 B1 *   6/2009  Granger-Jones ..... H04B 1/0483
                                                          340/584

(Continued)

OTHER PUBLICATIONS

Dinis R., et al., "Performance Trade-Offs with Quasi-Linearly Amplified OFDM through a Two-Branch Combining Technique," IEEE 46th Vehicular Technology Conference, Mobile Technology for the Human Race, May 1996, vol. 2, pp. 899-903.

(Continued)

*Primary Examiner* — Bobbak Safaipour
(74) *Attorney, Agent, or Firm* — Qualcomm Incorporated/Seyfarth Shaw LLP

(57) ABSTRACT

A user equipment (UE) includes a transmit chain that includes multiple radio frequency transmitters, multiple power amplifiers and a front end (FE) through which signals are transmitted. To achieve a high power UE solution, aspects of the disclosure selectively combine two or more power amplifier outputs based on an expected power output of the UE. To synchronously combine the outputs, an output feedback signal from a feedback receiver is used to adjust a delay and a phase of one or more signals associated with the power amplifiers.

27 Claims, 10 Drawing Sheets

(51) Int. Cl.
*H03F 3/72* (2006.01)
*H04B 1/00* (2006.01)

(56) References Cited

U.S. PATENT DOCUMENTS

| | | |
|---|---|---|
| 7,965,991 B2 | 6/2011 | Nash et al. |
| 8,285,221 B2 | 10/2012 | Kundmann et al. |
| 8,432,237 B2 | 4/2013 | Klemens et al. |
| 8,634,782 B2 | 1/2014 | Asuri et al. |
| 2006/0073802 A1* | 4/2006 | Chari ............... H04B 7/084 455/276.1 |
| 2007/0171997 A1 | 7/2007 | Weissman et al. |
| 2009/0161586 A1* | 6/2009 | Kasai ............... H04B 1/44 370/294 |
| 2011/0003563 A1* | 1/2011 | Gorbachov ........ H01Q 21/0025 455/78 |
| 2011/0222444 A1 | 9/2011 | Khlat et al. |
| 2013/0337754 A1* | 12/2013 | Khlat ............... H01P 1/15 455/78 |
| 2014/0070889 A1* | 3/2014 | Chen ............... H03F 1/0211 330/295 |
| 2014/0119259 A1* | 5/2014 | Nilsson ............ H04W 52/0206 370/311 |
| 2017/0093524 A1* | 3/2017 | Rozenblit ............ H03G 3/3042 |
| 2018/0006695 A1* | 1/2018 | Karsi ................. H04B 7/0608 |

OTHER PUBLICATIONS

International Search Report and Written Opinion—PCT/US2017/017951—ISA/EPO—dated May 23, 2017.

\* cited by examiner

HIGH POWER USER EQUIPMENT (HPUE) USING COHERENTLY COMBINED POWER AMPLIFIERS

CROSS-REFERENCE TO RELATED APPLICATION

The present application claims the benefit of U.S. Provisional Patent Application No. 62/319,221, filed on Apr. 6, 2016, and titled "HIGH POWER USER EQUIPMENT (HPUE) USING COHERENTLY COMBINED POWER AMPLIFIERS," the disclosure of which is expressly incorporated by reference herein in its entirety.

TECHNICAL FIELD

The present disclosure generally relates to wireless communication systems. More specifically, the present disclosure relates to a high power user equipment (UE) using coherently combined power amplifiers.

BACKGROUND

A wireless device may include multiple antennas at a transmitter and one or more antennas at a receiver. The transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce radio frequency (RF) signals. The power amplifier amplifies the RF signals prior to transmission via transmit antennas.

Electronic signals representing user data are transmitted from the transmit antennas through amplifiers used for increasing a power and/or an amplitude of the electronic signals. Most electronic amplifiers operate by using power from a power supply, and controlling an output signal to match the shape of an input signal, while providing a higher amplitude signal.

One widely used type of electronic amplifier is a power amplifier. A power amplifier is a versatile device used in various applications to meet design requirements for signal conditioning, special transfer functions, analog instrumentation, analog computation, and the like. Power amplifiers are often used in wireless applications, and may employ RF amplifier designs for use in the RF range of the electromagnetic spectrum. An RF power amplifier is a type of electronic amplifier used to convert a low-power RF signal into a signal of significant power, typically for driving an antenna of a transmitter. RF power amplifiers may be used to increase the range of a wireless communication system by increasing the output power of a transmitter.

SUMMARY

In an aspect of the present disclosure, a user equipment (UE) is presented. The UE includes a first antenna and a second antenna. The UE also includes first switched combiner circuitry and second switched combiner circuitry. The first switched combiner circuitry is coupled to the first antenna and the second switched combiner circuitry is coupled to the second antenna. Each of the first switched combiner circuitry and the second switched combiner circuitry are operable to coherently combine signals from a first transmit chain and a second transmit chain. The UE further includes a first power amplifier selectively coupled to the first switched combiner circuitry and the second switched combiner circuitry. The first power amplifier is operable to amplify a signal from the first transmit chain. Furthermore, the UE includes a second power amplifier selectively coupled to the first switched combiner circuitry and the second switched combiner circuitry. The second power amplifier is operable to amplify a signal from the second transmit chain.

In another aspect of the present disclosure, a method of coherent combining within a user equipment (UE) is presented. The method includes coherently combining, at a first switched combiner circuit or a second switched combiner circuit, amplified signals of a first transmit chain and a second transmit chain. The coherent combining of the first switched combiner circuit or the second switched combiner circuit is based on whether the first transmit chain and the second transmit chain are coupled to the first switched combiner circuit or the second switched combiner circuit. The amplified signals of the first transmit chain and the second transmit chain are received at a first power level. The method also includes transmitting a coherently combined signal from the amplified signals of the first transmit chain and the second transmit chain over a first antenna or a second antenna at a second power level greater than the first power level. The transmitting over the first antenna or the second antenna is based on whether the first transmit chain and the second transmit chain are coupled to the first switched combiner circuit or the second switched combiner circuit.

In an aspect of the present disclosure, a user equipment (UE) is presented. The UE includes a first antenna and a second antenna. The UE also includes first and second means for coherently combining signals from a first transmit chain and a second transmit chain. The first combining means is coupled to the first antenna and the second combining means is coupled to the second antenna. The UE further includes a means for amplifying a signal from the first transmit chain. The first transmit chain amplifying means is selectively coupled to the first combining means and the second combining means. Furthermore, the UE includes a means for amplifying a signal from the second transmit chain. The second transmit chain amplifying means is selectively coupled to the first combining means and the second combining means.

In yet another aspect of the present disclosure, a non-transitory computer-readable storage medium for wireless communication in a wireless network includes non-transitory program code recorded thereon. The program code includes program code to coherently combine, at a first switched combiner circuit or a second switched combiner circuit, amplified signals of a first transmit chain and a second transmit chain. The combination is based on whether the first transmit chain and the second transmit chain are coupled to the first switched combiner circuit or the second switched combiner circuit. The amplified signals of the first transmit chain and the second transmit chain are received at a first power level. The program code also includes program code to transmit a coherently combined signal from the amplified signals of the first transmit chain and the second transmit chain over a first antenna or a second antenna at a second power level greater than the first power level. The transmitting is based on whether the first transmit chain and the second transmit chain are coupled to the first switched combiner circuit or the second switched combiner circuit.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
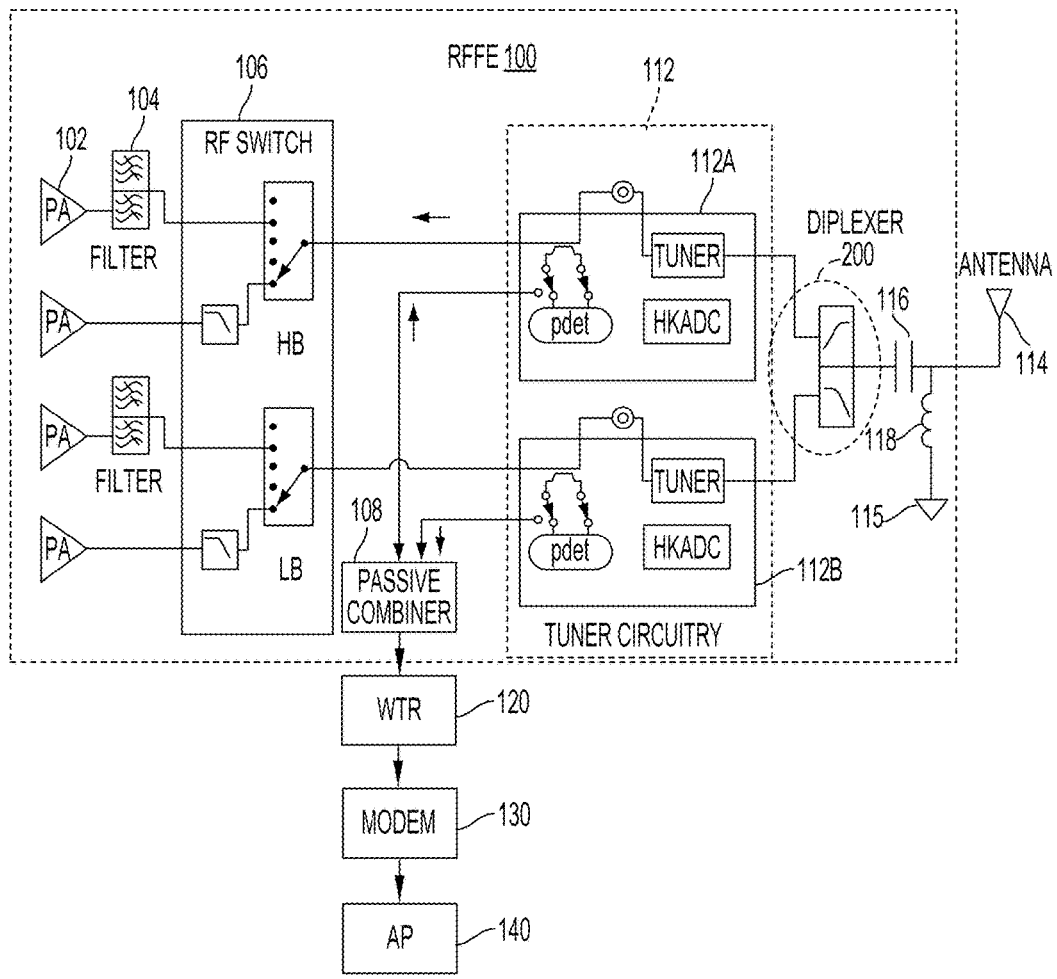
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A radio frequency power amplifier is a type of electronic amplifier used to convert a low-power RF signal into a signal of significant power, typically for driving an antenna of a transmitter. RF power amplifiers may be used to increase the range of a wireless communication system by increasing the output power of a transmitted signal. A wireless device, such as a user equipment (UE), may include transmit chains that are composed of multiple radio frequency transmitters, multiple power amplifiers, multiple antennas and one or more front end (FE) devices through which signals are transmitted from the UE. The transmit chains of the UE, however, may include a class of power amplifiers that are designed for meeting a power level specified for a current device generation. Unfortunately, meeting an increased power level specified for a next generation device may involve replacing the current class power amplifiers.

Operating a UE at the increased power level is dependent on the capability of the UE. For example, some current generation UEs may include power amplifiers (e.g., Class-3 PAs) that can only amplify signals to a lower power level (e.g., 23 dBm). Achieving higher power levels (e.g., 26 dBm or higher) may involve replacing the power amplifiers of the UE with next generation power amplifiers (e.g., Class-2 PAs). Unfortunately, replacing the power amplifiers of a UE is very expensive and may require a redesign of components that comprise the transmit chains.

Further, UEs including next generation power amplifiers may not achieve optimal or improved power performance when operating in networks that do not support the higher power level transmission. For example, a UE configured according to the higher power class may be specified to transmit below the higher power class when operating in conventional networks (e.g., existing 23 dBm power Class-3). In addition, a dedicated antenna for high power level transmission may be blocked or suffer from interference or other impediments causing the UE to fail to transmit at the higher transmit power level.

Offered is a low cost solution to achieve higher transmit power levels with UEs having power amplifiers specified for lower transmit power levels. For example, power amplifiers that are specified for lower transmit power levels include conventional power amplifiers (e.g., Class-3 PAs). In one aspect of the present disclosure, a higher transmit power level is achieved through coherent combining of power amplifier signals. In addition, antenna switch diversity may be used to select an antenna for transmitting at the higher transmit power level. Aspects of the present disclosure also involve operation using a single transmit chain during low power operation to provide power savings. Two signals (e.g., from power amplifiers) may be adjusted according to frequency, and are close in phase and amplitude to increase a power level of a coherent combined output signal.

For example, when an expected transmit power level is above a threshold power (e.g., 23 dBm) coherent combining is activated and first and second amplified signals from two power amplifiers are coherently combined using switched combiner circuitry. In this example, a first signal amplified using a first Class-3 power amplifier is coherently combined with a second signal amplified using a second Class-3 power amplifier to provide a coherently combined signal at a Class-2 power amplifier level.

That is, aspects of the present disclosure enable transmission of a signal at a Class-2 power amplifier level using Class-3 power amplifiers. According to this aspect of the present disclosure, coherent combining using existing power amplifiers (e.g., silicon power amplifiers) to enable a high power UE avoids the challenging and risky silicon design of new power amplifiers. In operation, an appropriate antenna may be selected for transmitting at the higher power level. The threshold power may be determined based on a maximum output power capability of the transmit components (e.g., antenna) of the UE. For example, the threshold power (e.g., 23 dBm) may be 3 dBm below the maximum output power of 26 dBm. Otherwise, when the expected transmit power level is equal or below the threshold power, the coherent combining is bypassed.

In one aspect of the disclosure, a signal from a first transmit chain, amplified with a first power amplifier (e.g., Class-3 power amplifier) is coherently combined with a signal from a second transmit chain, amplified with a second power amplifier (e.g., Class-3 power amplifier). Prior to coherently combining the first and second amplified signals, a feedback implementation may be performed to improve the transmit power level of the combined signal. For example, a modem may be configured to generate a phase control signal and/or a delay control signal to adjust a delay and/or phase of the signal from the first chain and/or the second transmit chain. The modem may also be configured for gain adjustment of the first transmit chain relative to the second transmit chain to substantially achieve a same power of both the first and second chains at the combiner output.

In one configuration, the phase and/or delay of the first transmit chain and/or the second transmit chain are adjusted to improve the power gain achieved due to the coherent combination. For example, the output of the coherently combined transmit chains may be fed back to a correlator through a feedback receiver. A phase or delay is adjusted in accordance with a correlation process at the correlator. For example, a reference signal from the first transmit chain or the second transmit chain may be correlated with the feedback signal and the phase control signal and/or delay control signal is generated based on the correlation.

FIG. 1A is a schematic diagram of a radio frequency (RF) front end (RFFE) module 100 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filter 104 filters the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), a diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120.

The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
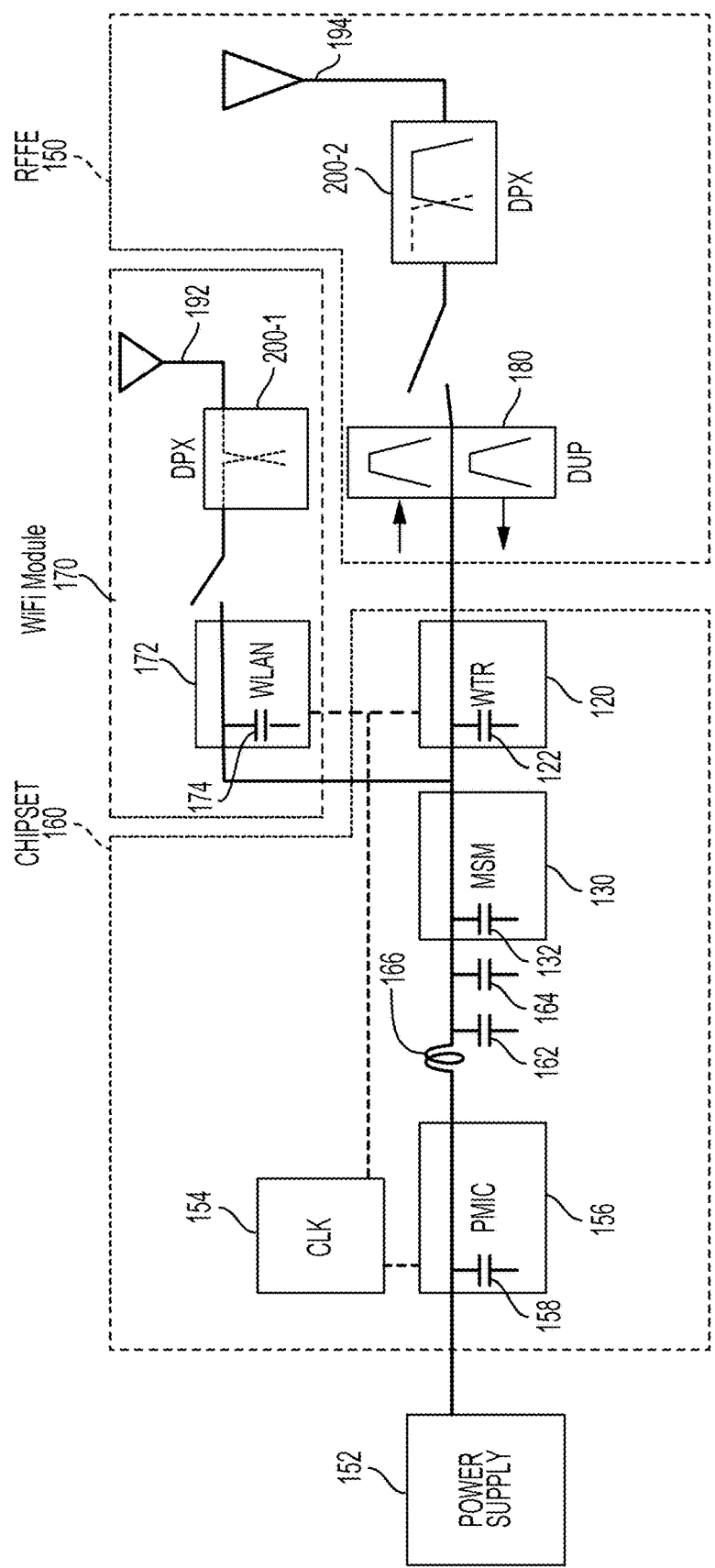
FIG. 1B is a schematic diagram of a radio frequency (RF) front end (RFFE) module and a WiFi module employing diplexers for a chipset to provide carrier aggregation according to aspects of the present disclosure.

FIG. 1B is a schematic diagram of a WiFi module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
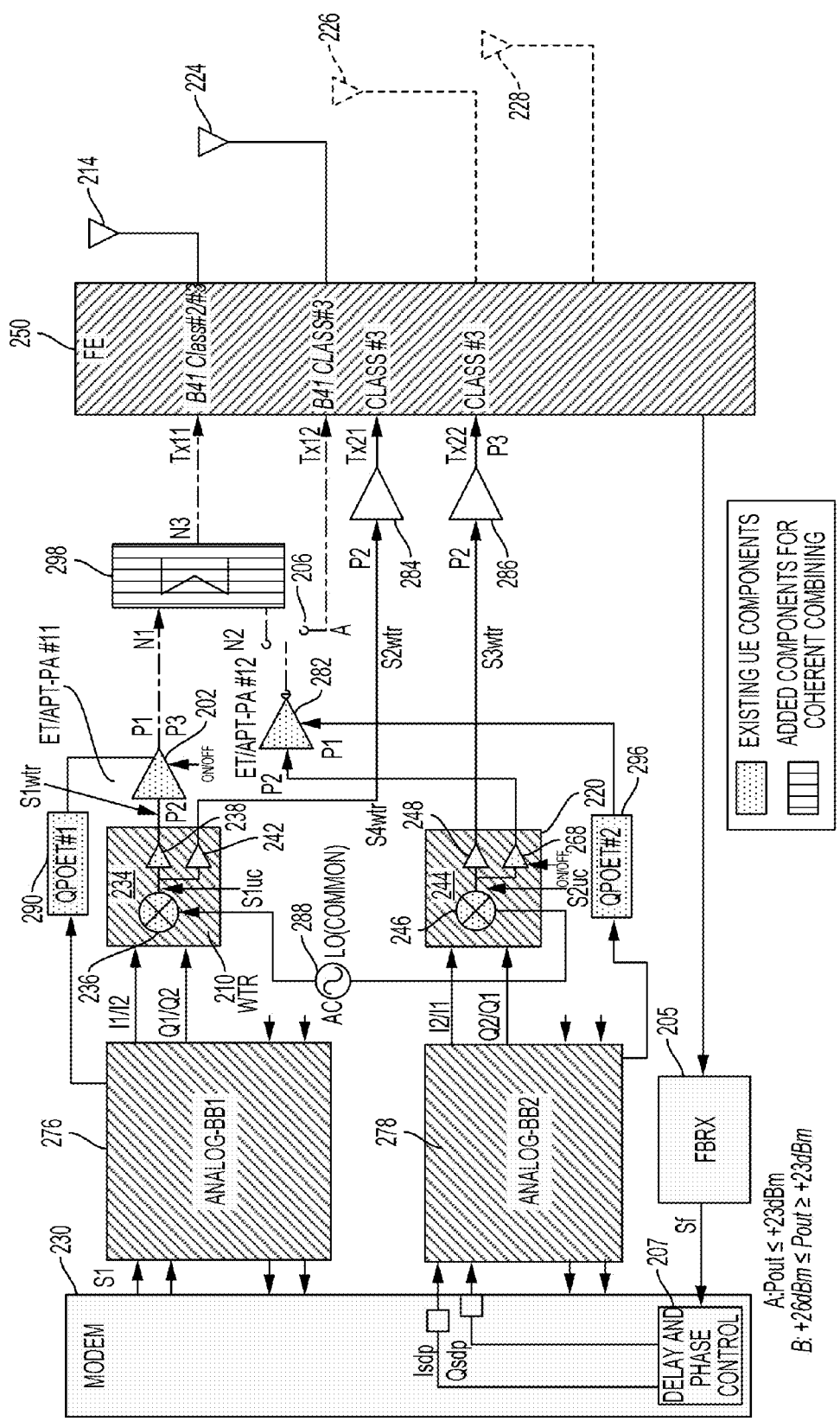
FIG. 2A illustrates a wireless device configured to perform antenna switch diversity using coherently combined power amplifiers according to one or more aspects of the disclosure.

FIG. 2A illustrates a wireless device configured to perform coherent combining of power amplified signals according to aspects of the disclosure. The wireless device includes a digital module such as a modem 230. The modem 230 is coupled to a first baseband processor 276 and a second baseband processor 278. The wireless device further includes a first wireless transceiver (WTR) 210, a second WTR 220, power amplifiers 202, 282, 284 and 286, first switched combiner circuitry 298, a radio frequency front end (RFFE) 250, and antennas 214, 224, 226 and 228. Radio frequency signals from the wireless device may be transmitted through the antennas 214, 224, 226 and 228 from signals of multiple transmit chains. For example, the first baseband processor 276 and the first WTR 210 may be included in a first transmit chain. The second baseband processor 278 and the second WTR 220 may be included in a second transmit chain. The different transmit chains may also include power amplifiers, antennas and/or other components to facilitate transmission of the radio frequency signals.

An input baseband signal is modulated using the modem 230, amplified using the power amplifiers 202, 282, 284 and 286, and transmitted as a radio frequency (RF) signal via the RFFE 250 and the antennas 214, 224, 226 and 228 that are coupled to the RFFE 250. As noted, the antennas may be part of transmit chains. For example, the antenna 214 may be included in the first transmit chain while the antenna 224 is included in the second transmit chain. To generate an RF signal according to quadrature modulation, an input signal is first processed by a baseband processor (e.g., the first baseband processor 276 and/or the second baseband processor 278) to generate baseband signals having an in-phase signal (I) component (e.g., I1, I2) and a quadrature (Q) signal component (e.g., Q1, Q2). A first in-phase signal I1 from the first baseband processor 276 is transmitted to the first WTR 210 and the second in-phase signal I2 from the second baseband processor 278 is transmitted to the second WTR 220.

The first WTR 210 may include a first up-converter 234 including a first mixer 236 and driver amplifiers 238 and 242. The second WTR 220 may include a second up-converter 244 including a second mixer 246 and driver amplifiers 248 and 268. The WTRs 210 and 220 may further condition (e.g., convert to analog, filter, frequency up-convert) the in-phase signal component and the quadrature signal component to generate WTR signals (e.g., $S1_{wtr}$, $S2_{wtr}$, $S3_{wtr}$, $S4_{wtr}$) that are transmitted to the power amplifiers 202, 282, 284 and 286. For example, the first up-converter 234 and the second up-converter 244 up-convert the analog signals (e.g., in-phase signal (I) component (e.g., I1, I2) and a quadrature (Q) signal component (e.g., Q1,Q2)) from the baseband signals to radio frequency signals (e.g., an up-converted signal).

A single reference oscillator, such as a local oscillator 288, is configured to drive the first transmit chain and the second transmit chain. The local oscillator 288 may be coupled to the first up-converter 234 and the second up-converter 244. The up-conversion may be implemented based on the local oscillator 288. For example, the first mixer 236 or the second mixer 246 may use a signal from the local oscillator 288 to up-convert the received baseband signals to the radio frequency signals. Using the same local oscillator 288 reduces phase drift between the two combined paths.

Alternatively, two separated local oscillators LO1 and LO2 can be used on for the first transmit chain and the second transmit chain, respectively. In one aspect, both local oscillators, LO1 and LO2, are set to a same frequency and same phase. The two separate local oscillators at the same frequency support the HPUE function to generate a Class-2 PA from low power amplifiers (e.g., two Class-3 Pas). To support carrier aggregation mode, each local oscillator is set to a different frequency. In carrier aggregation, each transmit chain transmits at a different RF frequency operating in Class-3 mode (e.g., the power of RF signals from the first transmit chain and RF signals from the second transmit chain is limited to +23 dBm).

The up-converted signals (e.g., $S1_{uc}$ and $S2_{uc}$) may be provided to the driver amplifiers 238, 242, 248 and 268. For example, the up-converted signals $S1_{uc}$ are transmitted to the driver amplifiers 238 and 242 while the up-converted signals $S2_{uc}$ are transmitted to the driver amplifiers 248 and 268.

The driver amplifiers 238, 242, 248 and 268 may be configured to amplify the up-converted signals and provide the amplified up-converted signal (e.g., $S1_{wtr}$, $S2_{wtr}$, $S3_{wtr}$, $S4_{wtr}$) to the power amplifiers 202, 282, 284 and 286. Each of the power amplifiers 202, 282, 284 and 286 includes a first input port, P1, to receive an input supply voltage (not shown for power amplifiers 284 and 286) and a second input port P2 to receive an input RF signal from the first WTR 210. For example, the power amplifier 202 includes an input port P1 coupled to a first envelope tracking supply 290 to receive an adjusted power supply from the first envelope tracking supply 290 according to an envelope tracking implementation. The first envelope tracking supply 290 is coupled between the first baseband processor 276 and the power amplifier 202. With envelope tracking, the RF signal from a power supply voltage applied to the power amplifier through the first envelope tracking supply 290 is continuously adjusted based on an envelope signal from the first baseband processor 276 to ensure that the amplifier is operating at peak efficiency for power specified at each instance of transmission.

Similarly, the power amplifier 282 includes an input port P1 coupled to a second envelope tracking supply 296 to receive an adjusted power supply from the first envelope tracking supply 290 according to the envelope tracking implementation. The second envelope tracking supply 296 is coupled between the second baseband processor 278 and the power amplifier 282. In this case, an RF signal from a power supply voltage applied to the power amplifier through the second envelope tracking supply 296 is continuously adjusted based on an envelope signal from the second baseband processor 278 to ensure that the power amplifier 282 is operating at peak efficiency for power specified at each instance of transmission.

Each of the power amplifiers 202, 282, 284 and 286 includes an output port, P3, to transmit an output RF signal. For example, the power amplifier 202 includes an output port, P3, coupled to a first node (e.g., input port), N1, of first switched combiner circuitry 298. The power amplifier 282 includes an output port P3 that is selectively coupled to a second node (e.g., input port), N2, of the first switched combiner circuitry 298 via a first switch device 206. When a higher transmit power level is desired, the first switch device 206 selectively couples the power amplifier 282 to the first transmit chain. In this case, the amplified signal from the power amplifier 282 and the amplified signal from the power amplifier 202 are coherently combined and provided to the antenna 214, via a third node, N3, (e.g., output port) of the first switched combiner circuitry 298. The coherent combination of the amplified signals from the power amplifier 202 and the power amplifier 282 results in a higher transmit power level (e.g., 26 dBm). This transmit power level is higher than the transmit power level (e.g., 23 dBm) available from the power amplifiers 202 and 282, without the coherent combination. Thus, the transmit power level of the wireless device can be increased using existing lower power level power amplifiers.

When a lower transmit power level is desired, the first switch device 206 selectively couples the power amplifier 282 to the RFFE 250 and the antenna 224. Thus, the first switch device 206 causes the power amplifier 282 to bypass the first switched combiner circuitry 298. For example, to coherently combine the amplified signals from the power amplifier 202 and the power amplifier 282 to achieve the higher transmit power level, the power amplifier 282 may be included in the first transmit chain. A resulting coherently combined signal, Tx11 that is output from the first switched combiner circuitry 298 is transmitted to the antenna 214 via the RFFE 250. The other power amplifiers may be coupled to the RFFE 250 to provide lower power levels. For example, the output port, P3, of the power amplifier 284 is coupled to one of the antennas 226 or 228 via the RFFE 250 to transmit RF signals (e.g., Tx21) from the power amplifier 284 to a receiver (not shown). Similarly, the output port, P3, of the power amplifier 286 is coupled to antennas 226 or 228 via the RFFE 250 to transmit RF signals (e.g., Tx22) from the power amplifier 286 to a receiver (not shown).

The first switched combiner circuitry 298 is configured to coherently combine an amplified signal from the output port, P3, of the power amplifier 202 and an amplified signal from the output port, P3, of the power amplifier 282 when certain communication conditions are satisfied. For example, the power amplifier 282 is selectively coupled to the first switched combiner circuitry 298 and the antenna 224 via the RFFE 250. When the power amplifier 282 is coupled (via the first switch device 206) to the first switched combiner circuitry 298, the coherently combined signals are transmitted through the first antenna at a higher transmit power level. When the second power amplifier is coupled to the second antenna, the output port, P3, of the power amplifier 282 is coupled to the antenna 224 via the RFFE 250 to transmit RF signals (e.g., Tx12) from the power amplifier 284 to a receiver (not shown) at a lower transmit power level. In this case, at least some of the other power amplifiers (e.g., the power amplifier 202) may be deactivated to reduce power consumption.

A feedback radio frequency signal, $S_{fb}$ from the RFFE 250 may be fed back into the modem through a feedback receiver 205, which is sampling one or more output radio frequency signals (e.g., Tx11, Tx12, Tx21, Tx22) for transmission to the one or more antennas via the RFFE 250. The feedback radio frequency signal, $S_{fb}$ may be used to adjust delay, phase, and gain of the different transmit chains in order to improve coherent combining of radio frequency signals from different transmit chains. For example, to coherently combine the first transmit chain and the second transmit chain at the first switched combiner circuitry 298, the delay and phase of the first transmit chain and/or the second transmit chain may be adjusted to synchronize the two transmit chains.

The feedback radio frequency signal, $S_{fb}$ is based on one or more output radio frequency signals (e.g., Tx11, Tx12, Tx21, and Tx22) from the power amplifiers (e.g., 202, 282, 284 and/or 286) and/or the first switched combiner circuitry 298. The feedback radio frequency signal, $S_{fb}$ is fed back to the modem 230 to adjust a delay and phase of the signals from the first transmit chain and/or the second transmit chain. In one aspect of the disclosure, the modem 230 includes a delay and phase controller 207 that generates delay, phase, and gain control signals for adjusting the delay and phase control signals of the first and/or second transmit paths. For example, the delay and phase controller 207 generates an in-phase signal ($IS_{dp}$) component and a quadrature ($QS_{dp}$) signal component of the delay and phase control signals. The in-phase signal ($IS_{dp}$) component and a quadrature ($QS_{dp}$) signal are then provided to the second baseband processor to adjust the phase and delay of the second transmit chain.

Figure 2B:
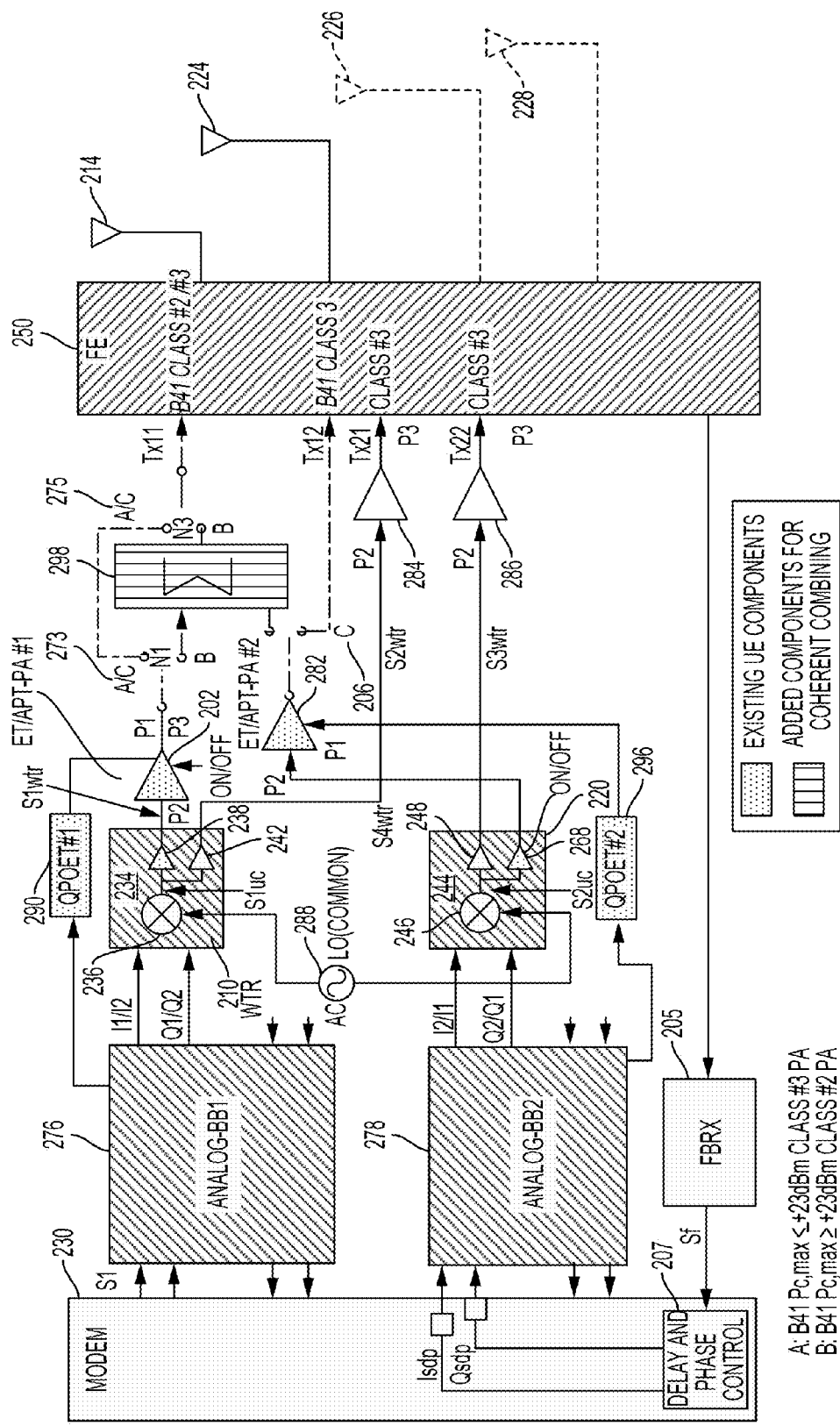
FIG. 2B is a diagram illustrating another aspect of the wireless device of FIG. 2A according to an aspect of the present disclosure.

FIG. 2B is a diagram illustrating another example of the wireless device of FIG. 2A according to an aspect of the present disclosure. In addition to the components of FIG. 2A, FIG. 2B includes a second switch device 273 and a third switch device 275. In FIG. 2B, however, the second switch device 273 and the third switch device 275 are configured to selectively couple the power amplifier 202 to the first node N1 and the third node N3 of the first switched combiner circuitry 298. For example, when a higher transmit power level is desired, the second switch device 273 couples the power amplifier 202 to the first node, N1, of the first switched combiner circuitry 298. The third switch device couples the third node, N3, to the antenna 214 via the RFFE 250. In addition, the first switch device 206 couples the power amplifier 282 to the first node, N1, of the first switched combiner circuitry 298. In this case, the signal from the power amplifier 282 and the signal from the power amplifier 202 are coherently combined and the higher transmit power level is provided to the antenna 214, via the third node, N3, (e.g., output port) of the first switched combiner circuitry 298.

As noted, when a lower transmit power level is desired, the first switch device 206 couples the power amplifier 282 to the RFFE 250 and the antenna 224, thereby bypassing the first switched combiner circuitry 298. Alternatively, the lower transmit power level may be provided by the power amplifier 202. In this case, the second switch device 273 and the third switch device 275 bypass the first switched combiner circuitry 298 and directly couple the power amplifier 202 to the antenna 214 without coherent combining. Wasted power may be avoided by deactivating the second transmit chain.

Figure 2C:
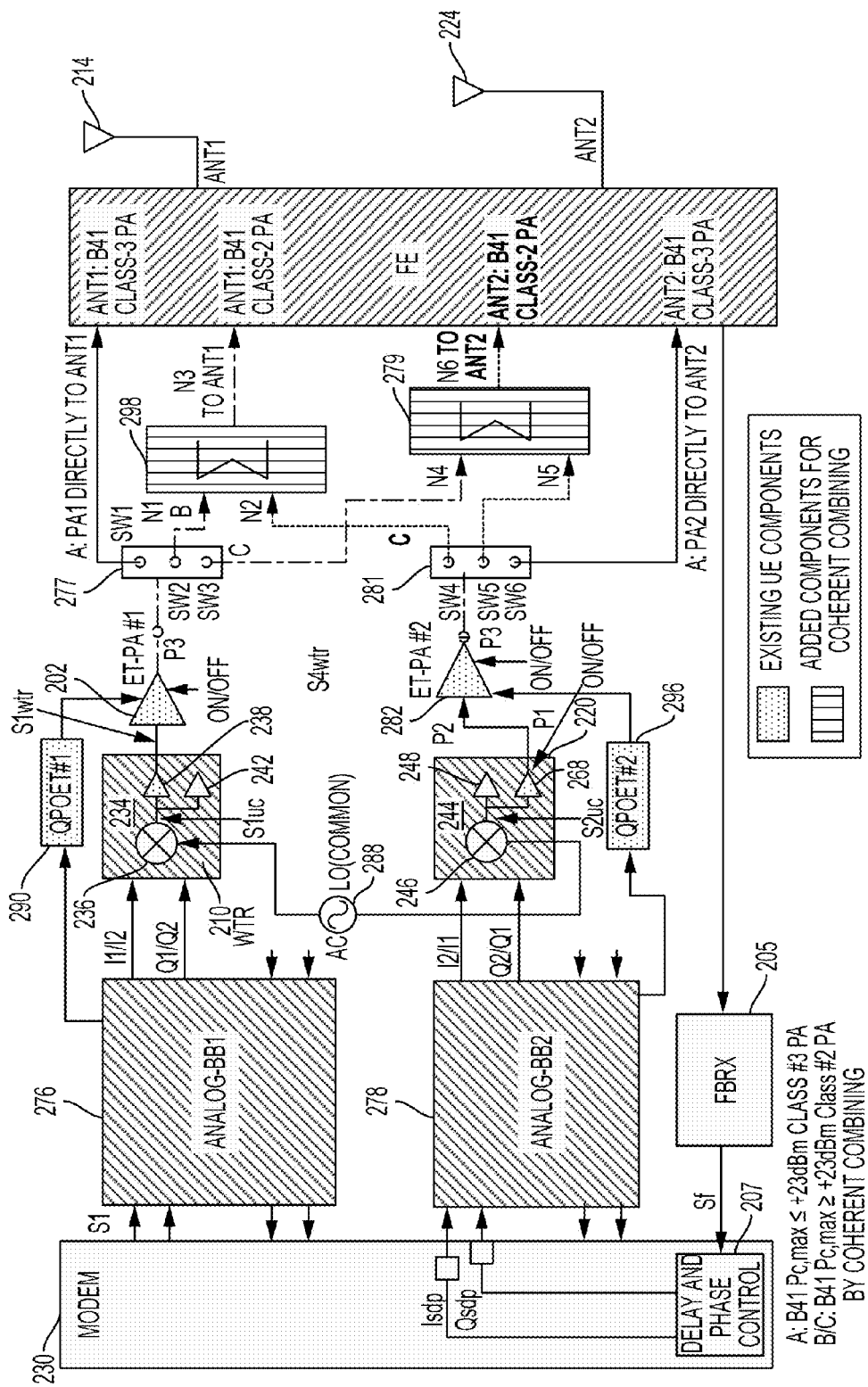
FIG. 2C is a diagram illustrating yet another aspect of the wireless device of FIG. 2A configured to perform antenna switch diversity using coherently combined power amplifiers according to an aspect of the present disclosure.

FIG. 2C is a diagram of another example of the wireless device of FIG. 2A configured to perform antenna switch diversity using coherently combined power amplifiers according to an aspect of the present disclosure. In addition to the components of FIG. 2A, FIG. 2C includes second switched combiner circuitry 279. FIG. 2C also includes the switch device 277 and the switch device 281 instead of the first switch device 206. The third node, N3, of the first switched combiner circuitry 298 is coupled to the antenna 214 via the RFFE 250. The second switched combiner circuitry 279 includes a fourth node, N4, (input node), a fifth node, N5, (input node) and a sixth node, N6, (output node). The sixth node, N6, of the second switched combiner circuitry 279 is coupled to the antenna 224 via the RFFE 250.

The switch device 277 includes a first switch node, SW1, a second switch node, SW2, and a third switch node, SW3. The switch device 281 includes a fourth switch node, SW4, a fifth switch node, SW5, and a sixth switch node, SW6. The switch node SW1 is directly coupled to the antenna 214 via the RFFE 250. The switch node SW2 is coupled to the first node, N1, of the first switched combiner circuitry 298. The switch node SW3 is coupled to the fourth node, N4, of the second switched combiner circuitry 279 for coherent combining of the power amplifier 202 and the power amplifier 282 using the second switched combiner circuitry 279.

The switch node SW4 is coupled to the second node, N2, of the first switched combiner circuitry 298 for coherent combining of the power amplifier 202 and the power amplifier 282 using the first switched combiner circuitry 298. The switch node SW6 is directly coupled to the antenna 224 via the RFFE 250 and the switch node SW5 is coupled to the fifth node, N5, of the second switched combiner circuitry 279. The switch device 277 is configured to selectively couple the third output port, P3, of the power amplifier 202 to either the first switch node, SW1, the second switch node, SW2, or the third switch node, SW3. The switch device 281 is configured to selectively couple the third output port, P3, of the power amplifier 282 to either the fourth switch node, SW4, the fifth switch node, SW5, or the sixth switch node, SW6.

To achieve a lower transmit power level using the power amplifier 202, the third output port, P3, of the power amplifier 202 is coupled to the first switch node, SW1, which is coupled to the antenna 214 via the RFFE 250 and bypasses both the first switched combiner circuitry 298 and the second switched combiner circuitry 279. Similarly, to achieve a lower transmit power level using the power amplifier 282, the third output port, P3, of the power amplifier 282 is coupled to the sixth switch node, SW6, which is coupled to the antenna 224 via the RFFE 250 and bypasses both the first switched combiner circuitry 298 and the second switched combiner circuitry 279.

To achieve a higher transmit power level, an amplified signal from the power amplifier 202 may be coherently combined with an amplified signal from the power amplifier 282 using the first switched combiner circuitry 298 or the second switched combiner circuitry 279, depending on whether the antenna 214 or the antenna 224 is selected for high power transmission. For example, to achieve a higher transmit power level using the first switched combiner circuitry 298, the third output port, P3, of the power amplifier 202 is coupled to the second switch node, SW2, and the third output port, P3, of the power amplifier 282 is coupled to the fourth switch node, SW4. The coherently combined higher transmit power level signal at the third node, N3, is provided to the antenna 214 via the RFFE 250. To achieve a higher transmit power level using the second switched combiner circuitry 279, the third output port, P3, of the power amplifier 282 is coupled to the fifth switch node, SW5, and the third output port, P3, of the power amplifier 202 is coupled to the third switch node, SW3. The coherently combined higher transmit power level signal at the sixth node, N6, is provided to the antenna 224 via the RFFE 250.

Figure 3:
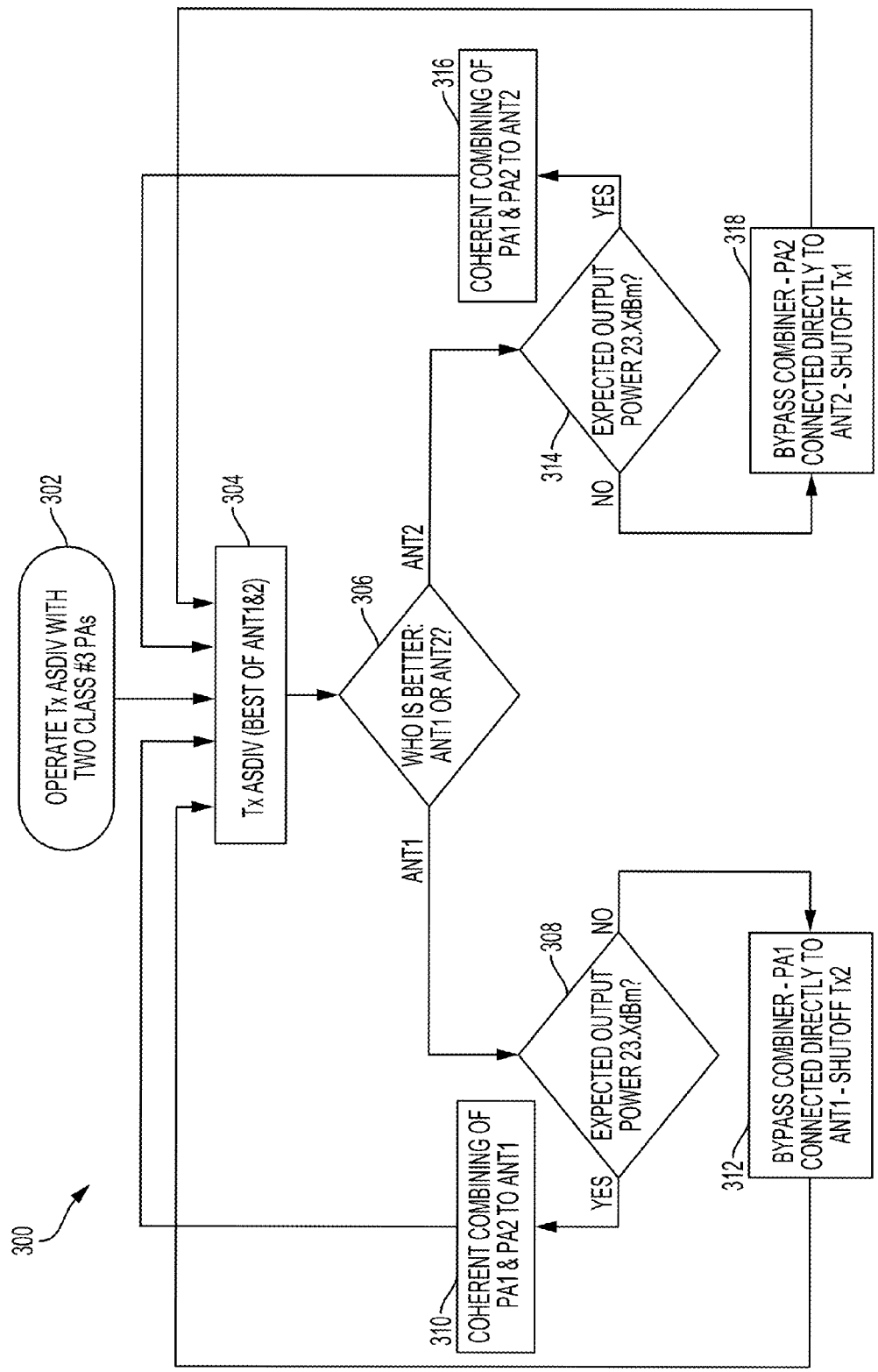
FIG. 3 is a process flow diagram illustrating an antenna switch diversity method for coherently combining power amplifiers according to aspects of the present disclosure.

FIG. 3 is a process flow diagram 300 illustrating an antenna switch diversity method for coherently combining power amplifiers according to aspects of the present disclosure. The antenna switch diversity method starts at block 302. At block 302, a user equipment configured to implement antenna switch diversity in conjunction with coherent combining includes two power amplifiers (first power amplifier and second power amplifier) configured to operate according to lower transmit power levels (e.g., Class-3 power amplifiers). At block 304, the UE identifies its available antennas (e.g., antenna 1 and antenna 2) according to the antenna switch diversity implementation. At block 306, the UE determines whether antenna 1 or antenna 2 is desirable for transmitting based on an expected transmit power level. For example, a modem determines the desirable antenna based on the expected transmit power level of the UE through the different transmit chains or channels. For example, if one antenna is determined to be blocked by a user's hand, the other antenna may be selected.

If it is determined that antenna 1 is more desirable than antenna 2, the method continues to block 308 where it is determined whether the expected transmit power level meets a threshold power. For example, at block 308 it is determined whether the expected transmit power level is greater than 23.X dBm, where X is the additional insertion loss of the switches that bypass the switched combiner circuitry. If the expected transmit power level is greater than 23.X dBm, the first power amplifier and the second power amplifier are coherently combined at block 310 and the resulting signal is transmitted via antenna 1. The process then returns to block 304. If, however, the expected transmit power level is not greater than 23.X dBm, the switched combiner circuitry is bypassed and the first power amplifier is directly coupled to the first antenna. At least some portions of a second transmit chain (including the second antenna and/or the second power amplifier, for example) are shut off or deactivated.

If, however, it is determined that antenna 2 is more desirable than antenna 1 the method continues to block 314 where it is determined whether the expected transmit power level meets a threshold power. For example, at block 314 it is determined whether the expected transmit power level is greater than 23.X dBm. If the expected transmit power level is greater than 23.X dBm, the first power amplifier and the second power amplifier are coherently combined at block 316 and the resulting signal is transmitted via antenna 2. The process then returns to block 304. If, however, the expected transmit power level is not greater than 23.X dBm, the switched combiner circuitry is bypassed and the second power amplifier is directly coupled to the second antenna at block 318. At least some portions of a first transmit chain (including the first antenna and/or the first power amplifier, for example) is shut off or deactivated. The process then returns to block 304.

Figure 4:
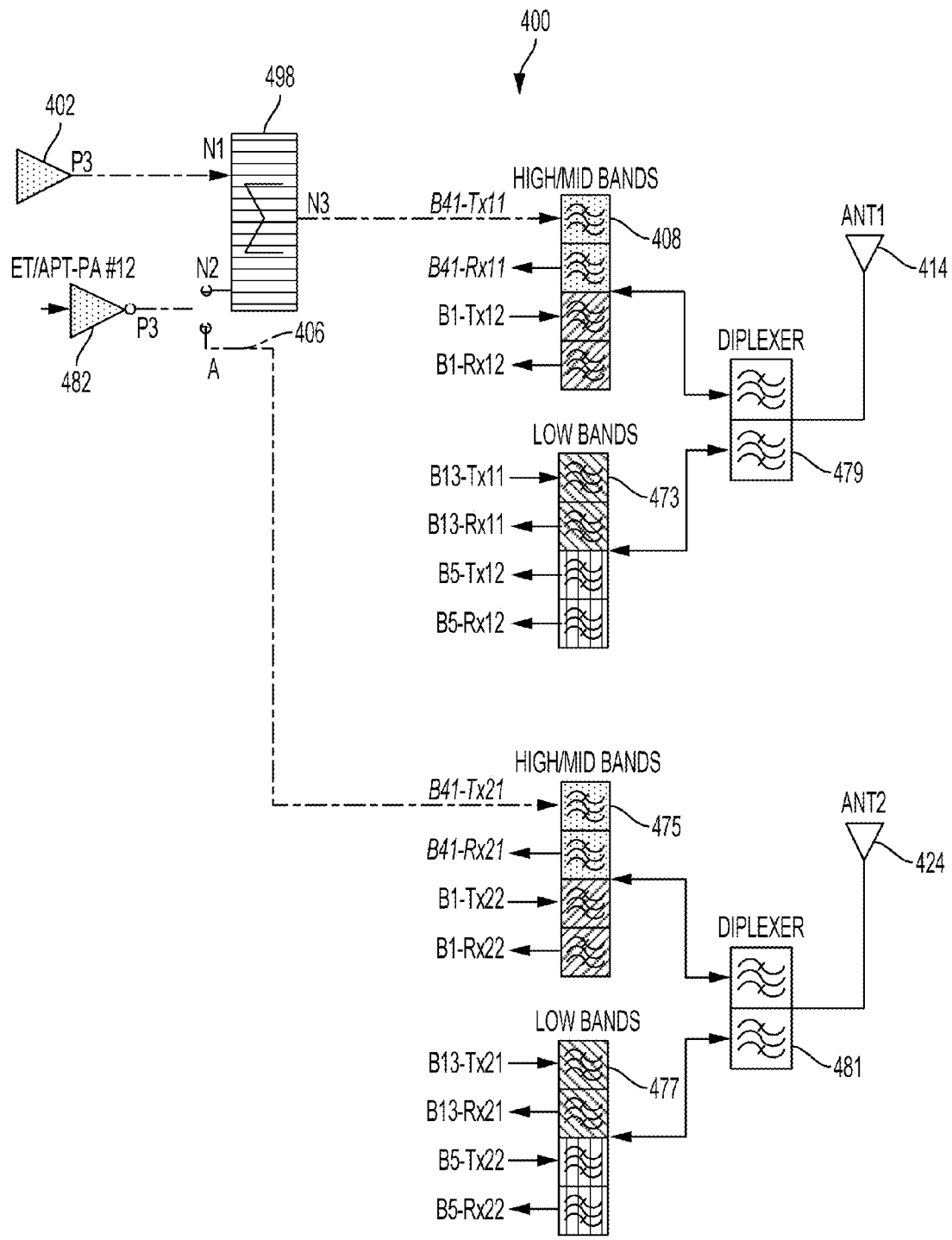
FIG. 4 shows a carrier aggregation implementation for coherent combining according to aspects of the present disclosure.

FIG. 4 shows a carrier aggregation implementation for coherent combining in a wireless device according to aspects of the present disclosure. For example, two separate local oscillators LO1 and LO2 can be used for the first transmit chain and the second transmit chain, respectively. To support carrier aggregation mode, each local oscillator is set to a different frequency. To support coherent combining each local oscillator is set to a same frequency. A wireless device 400 includes power amplifiers 402 and 482, switched combiner circuitry 498, a first switch device 406, multiplexers 408, 473, 475 and 477, diplexers 479 and 481, and antennas 414 and 424. The power amplifier 482 includes an output port P3 that is selectively coupled to a second node (e.g., input port), N2, of the switched combiner circuitry 498 via a first switch device 406. The power amplifier 402 includes an output port P3 that is directly coupled to a first node (e.g., input port), N1, of the switched combiner circuitry 498. When a higher transmit power level is desired, the first switch device 406 couples the power amplifier 482 to the switched combiner circuitry 498. In this case, the amplified signal from the power amplifier 482 and the amplified signal from the power amplifier 402 are coherently combined and provided to the antenna 414, via a third node, N3, (e.g., output port) of the switched combiner circuitry 498, the multiplexer 408 and the diplexer 479.

According to various examples, a UE operating in a multicarrier system (also referred to as carrier aggregation) is configured to aggregate certain functions of multiple carriers. Bandwidths allocated for carrier aggregation support multiple component carriers used for transmission in each direction. For example, B41 frequency band, B1 frequency band, B13 frequency band and B5 frequency bands may be supported for carrier aggregation. The transmit signal provided as a result of the coherent combination may be aggregated with other carriers for transmission at the antenna using the multiplexers 408 and 473 as well as the diplexer 479.

When a lower transmit power level is desired, the first switch device 406 directly couples the power amplifier 482 to the multiplexer 475. In this case, the signal from the power amplifier 482 is provided to the antenna 424, via the multiplexer 475 and the diplexer 481. The transmit signal provided by the power amplifier 482 may be aggregated with other carriers for transmission at the antenna 424 using the multiplexers 475 and 477 as well as the diplexer 481.

Figure 5A:
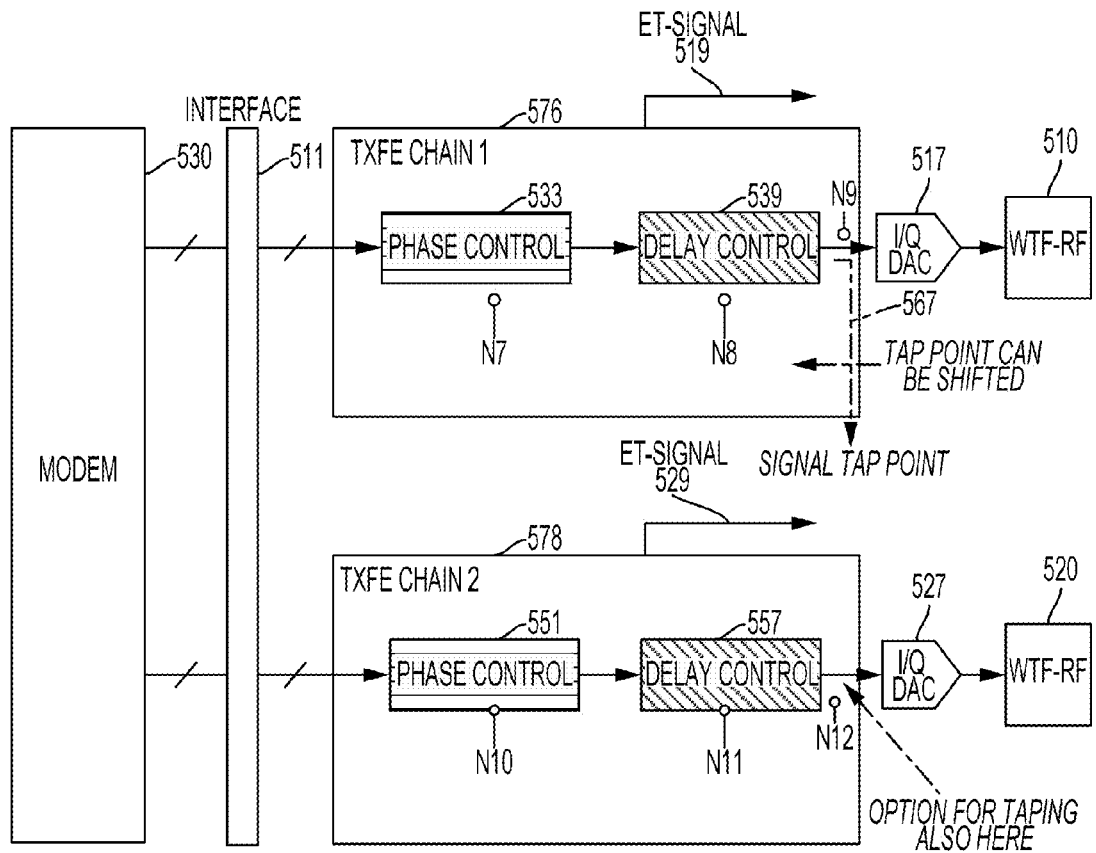
FIG. 5A illustrates a wireless device for controlling coherent combining of power amplifiers according to aspects of the present disclosure.
Figure 5B:
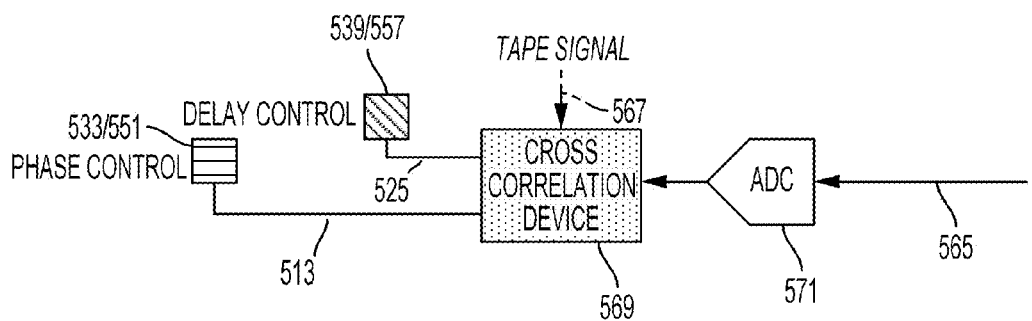
FIG. 5B illustrates a wireless device for controlling coherent combining of power amplifiers according to aspects of the present disclosure.

FIGS. 5A and 5B illustrate a wireless device 500 for controlling coherent combining of power amplifier signals according to aspects of the present disclosure. The wireless device 500 includes a digital module such as a modem 530 and an interface 511 coupled to the modem 530. Signals representing data received at the modem 530 may be transmitted through multiple transmit chains via the interface

511. For example, a first transmit chain includes a first transmit front end (TXFE) chain 576 (e.g., a first baseband processor), a first digital to analog converter (DAC) 517, and a first wireless transceiver (WTR) 510. A second transmit chain includes a second transmit front end (TXFE) chain 576 (e.g., a second baseband processor), a second digital to analog converter (DAC) 527 and a second wireless transceiver (WTR) 520.

In operation, data to be transmitted by the wireless device through the first transmit chain is transmitted through components of the first transmit chain up to the first WTR 510, and subsequently to a desired antenna (not shown) at a desirable power level. Similarly, data to be transmitted by the wireless device 500 through the second transmit chain is transmitted through components of the second transmit chain up to the second WTR 520, and subsequently to a desired antenna (not shown) at a desirable power level. For example, the first transmit chain may be deactivated when the second transmit chain is selected to transmit the data at a desirable power level or vice versa.

The first transmit front end (TXFE) chain 576 includes a first phase control device (e.g., phase control logic) 533, and a first delay control device 539. The second transmit front end (TXFE) chain 578 includes a second phase control device 551, and a second delay control device 557.

Envelope tracking for the first transmit chain may be implemented in the first transmit front end (TXFE) chain 576, to generate an envelope tracking signal 519 to one or more power amplifiers (not shown). Similarly, envelope tracking for the second transmit chain may be implemented in the second transmit front end (TXFE) chain 578, to generate an envelope tracking signal 529 to one or more power amplifiers (not shown).

The following implementations (for FIGS. 5A and B) are described with respect to the first transmit chain. Similar implementations, however, can be performed at the second transmit chain based on the desired power level for the transmit signal at the one or more antennas. For example, when the desirable transmit chain for transmitting the signal at the desirable power level is the first transmit chain, the second transmit chain is deactivated and vice versa. In some aspects, however, two or more power amplifiers (not shown) may be coherently combined for transmitting over an antenna of the first transmit chain. In this case, one of the power amplifiers may be selectively coupled to combiner circuitry (e.g., first switched combiner circuitry 298). For example, one or more of the power amplifiers may be selectively included within two or more transmit chains based on the desired power level of the transmit signal.

To generate the RF signal according to quadrature modulation, input signals from the modem 530 are provided to the first transmit front end (TXFE) chain 576. As the received signals traverse the first transmit front end (TXFE) chain 576, the signals are conditioned and processed by the components of the first transmit front end (TXFE) chain 576. A phase of the signals may be adjusted at the phase control device 533 and the result provided to the delay control device 539 for adjusting a delay of the signals.

The resulting transmit signal from the delay control device 539 is then transmitted to the first digital to analog converter (DAC) 517 for further processing.

To reduce loss when coherently combining amplified signals from different transmit chains, the delay and phase of the first transmit chain and/or the second transmit chain should be adjusted. For example, the delay and phase of the first transmit chain are adjusted such that the combination of the signals from the two different transmit chains achieve a higher power level for the transmit signal. To adjust the phase and delay of the first transmit chain, one or more nodes (e.g., N7, N8, respectively) of the first transmit chain are tapped and a reference node N9 is tapped to obtain a reference transmit signal or tapped signal (illustrated as tapped signal 567 in FIGS. 5A and 5B).

The tapped signal 567 is cross correlated (at cross correlation device 569) with a feedback signal 565, as shown in FIG. 5B. The feedback signal 565 may be a transmit RF signal from an output of the first DAC 517, an output of the first WTR 510 or an output of other downstream radio frequency front end device (not shown) of the first transmit chain. For example, the transmit RF signal is fed back through one or more feedback receivers (e.g., FBRX 205) and an analog to digital converter (ADC) 571 to obtain a feedback signal. The cross correlation device 569 generates a phase control signal 513 and/or a delay control signal 525 as a result of the cross correlation. The phase control signal 513 may be provided to the phase control device 533 (e.g., at node N7) to adjust a phase of the signals received at the first transmit front end (TXFE) chain 576. The delay control signal 525 may be provided to the delay control device 539 (e.g., at node N8) to adjust a delay of the signals received at the first transmit front end (TXFE) chain 576.

In one aspect of the disclosure, the cross correlator 569 may be a part of the modem 530. In this aspect, the cross correlator 569 may be part of the delay and phase controller of the modem (e.g., delay and phase controller 207). The cross correlator is used for determining the time delay and the phase of the transmit baseband signal for achieving optimal or improved coherent combining by cross-correlating the feedback signal 565 and the in-phase signal component and the quadrature signal component of the tapped reference transmit signal 567.

Aspects of the present disclosure reduce power consumption in the wireless device by deactivating or turning off portions of or all unused transmit chains in accordance with the coherent combining implementation. For example, when the expected transmit power level is below +23 dBm, the transmission is switched to a single path Class-3 envelope tracking (ET) power amplifier. The other transmit chain(s) is shut off to save power. For example, a first power amplifier of a first transmit chain is disabled when a second power amplifier of a second transmit chain is coupled to a second antenna to transmit at the expected power level of below +23 dBm. Alternatively, the second power amplifier of a second transmit chain is disabled when the first power amplifier of the first transmit chain is coupled to a first antenna to transmit at the expected power level of below +23 dBm. When the expected transmit power level is above +23 dBm, however, the UE switches to coherent combining state to combine the two channels ET-PA outputs coherently. The switched combiner circuitry protects the ET-PA, saving mismatch losses or return loss of 0.5 dB to 1 dB (depending on the duplexer, multiplexer (e.g., diplexer), front end filters and antenna voltage standing wave ratio (VSWR)).

The aspects of the present disclosure can be achieved on current wireless devices using existing WTRs, power trackers (to drive the PA), feedback receivers and the ET-PAs. Thus, the coherent combining implementation using existing power amplifiers (e.g., silicon power amplifiers) to enable a high power UE avoids the challenging and risky silicon design of new power amplifiers. Further, the implementation avoids development of a new power tracker specified to drive high power amplifiers that operate at output power that is 3 dB above regular Class-3 ET-PA. Additional components (e.g., switched combiner circuitry) to achieve coherent combining are small enough to avoid changing the size of the device. For example, a 2.2-2.8 GHz combiner size is compact: 2×1.5 mm.

The solution of coherent combining of power amplifiers achieves better power efficiency compared to a single high power (HP) UE having a single power amplifier that is configured for a higher power class. For example, the switched combiner circuitry (e.g., narrow band) implementation loss is merely 0.5 dB. Further, the switched combiner circuitry insertion loss (IL) of ~3.5 dB (3 dB+0.5 dB) reduces the front end (FE) filter mismatch loss by 0.5 dB-1 dB, which compensates for the switched combiner circuitry implementation loss.

Output thermal noise for the coherent combining implementation is lower by ~3 dB compared to the single high power (HP) UE having a single power amplifier that is configured for a higher power class. For example, output thermal noise for the coherent combining implementation is lowered because the signal from the power amplifiers is coherently combined while the thermal noise sources are non-coherently combined. Further, power is dissipated easier using two power amplifiers for the coherent combining implementation. For example, the power split between the two power amplifiers and therefor the heat dissipation is easier compared to the single high power amplifier. Moreover, power consumption of the second transmit chain was small when operating at the upper 3 dB range. At the lower transmit power level the second transmit chain is turned off and therefore has little or no power consumption.

Furthermore, conventional antenna switched diversity (ASDIV) with Class-3 power amplifiers have a reduced effective transmit power level. For example, the effective output power is ~24.8 dBm (23 dBm+ASDIV gain of ~1.76 dB). In contrast, antenna switched diversity with coherent combined power amplifiers achieves higher transmit power levels akin to those of a Class-2 power amplifier. Thus, the coherent combining implementation involving switching between two antennas significantly extends the coverage of the UE. For example, the effective transmit power for Class-3 power amplifiers, each at +23 dBm, is ~27.6 dBm. The effective transmit power is calculated as follows: 23 dBm+ASDIV gain of ~1.76 dB+coherent combining added power ~3 dB. This effective power for the coherent combining implementation is comparable to that of a single high power (HP) UE having a single power amplifier configured for a higher power class (e.g., Class-2). Thus, there is no need to develop a Class-2 power amplifier in light of the coherent combining implementation using Class-3 power amplifiers.

Figure 6:
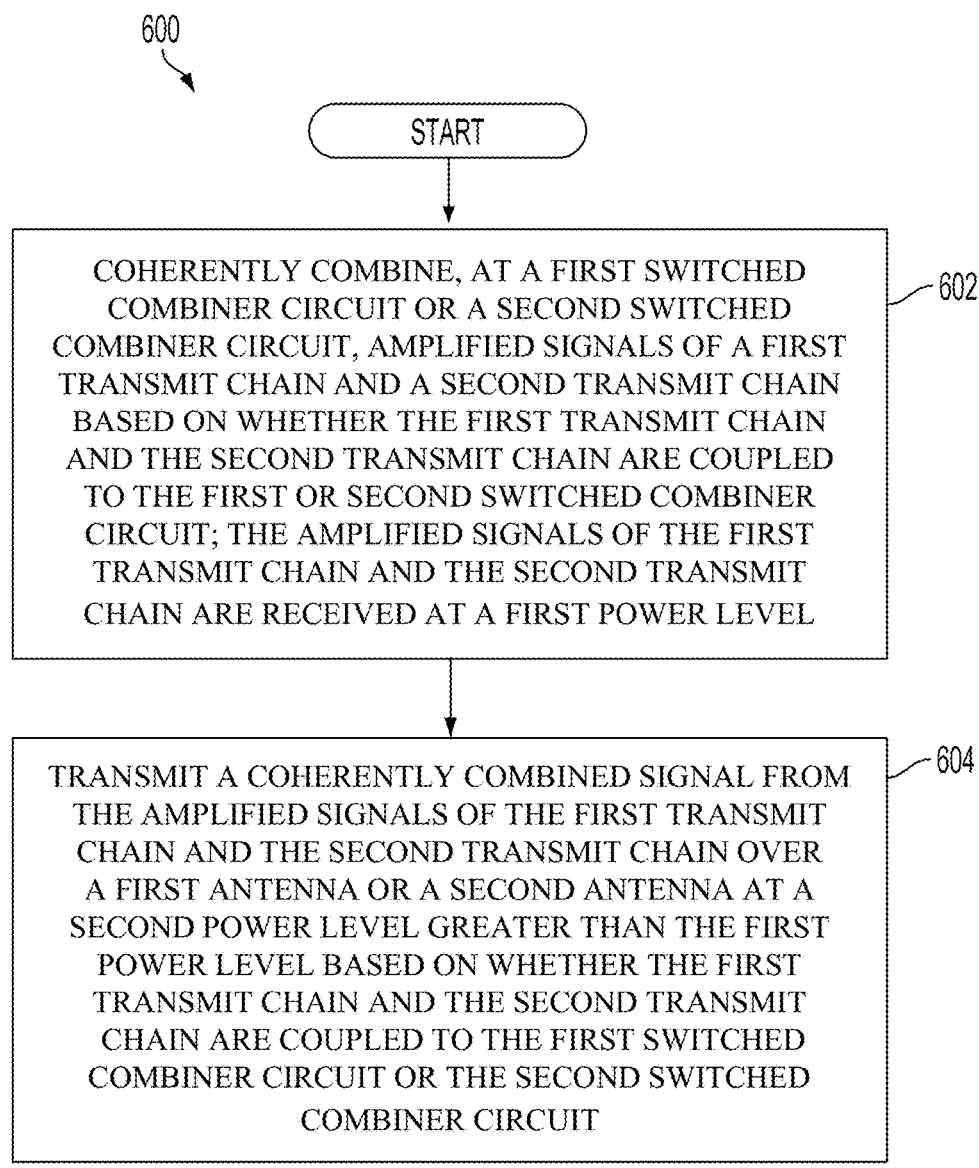
FIG. 6 is a process flow diagram illustrating a wireless communication method according to aspects of the present disclosure.

FIG. 6 is a process flow diagram illustrating a method 600 of coherent combining within a user equipment (UE) (e.g., high power user equipment (HPUE)) according to an aspect of the present disclosure. At block 602, amplified signals of a first transmit chain and a second transmit chain are coherently combined at a first switched combiner circuit or a second switched combiner circuit. The coherent combining at the first switched combiner circuit or the second switched combiner circuit is based on whether the first transmit chain and the second transmit chain are coupled to the first switched combiner circuit or the second switched combiner circuit.

The amplified signals of the first transmit chain and the second transmit chain are received at a first power level. For example, as shown in FIG. 2A, an amplified signal from the power amplifier 202 is coherently combined with an amplified signal from the power amplifier 282 at the first switched combiner circuitry. At block 604, a coherently combined signal from the amplified signals of the first transmit chain and the second transmit chain is transmitted over a first antenna or a second antenna at a second power level greater than the first power level. For example, as shown in FIG. 2A, coherent combining of amplified signals from first and second transmit chains, according to aspects of the present disclosure, enables transmission of a signal at a Class-2 power amplifier level using Class-3 power amplifiers to enable a high power UE. The transmitting is based on whether the first transmit chain and the second transmit chain are coupled to the first switched combiner circuit or the second switched combiner circuit.

According to a further aspect of the present disclosure, a high power user equipment (HPUE) is described. The HPUE includes means for coherently combining amplified signals. The HPUE also includes means for transmitting a coherently combined signal. The coherently combining means may be the switched combiner circuitry 279, 298, 498, the switch device 206, 277, 281 and/or 406, the modem 230, the delay and phase controller 207, the local oscillator 288, the cross correlator 569, the feedback receiver 205, 565 and/or the analog to digital converter (ADC) 571.

The transmitting means may any component(s) of a transmit chain (e.g., the first transmit chain and/or the second transmit chain). The transmit chain may include the baseband processor 276, 278, 576, 578 the wireless transceiver (WTR) 210, 220, 510, 520 the power amplifier 202, 282, 284, 286, the switched combiner circuitry 279, 298, 498, the radio frequency front end (RFFE) 250, the antenna 214, 224, 226, 228, 414, 424, the multiplexer 408, 473, 475 and 477 and/or the diplexer 479, 481. In another aspect, the aforementioned means may be any module or any apparatus configured to perform the functions recited by the aforementioned means.

Figure 7:
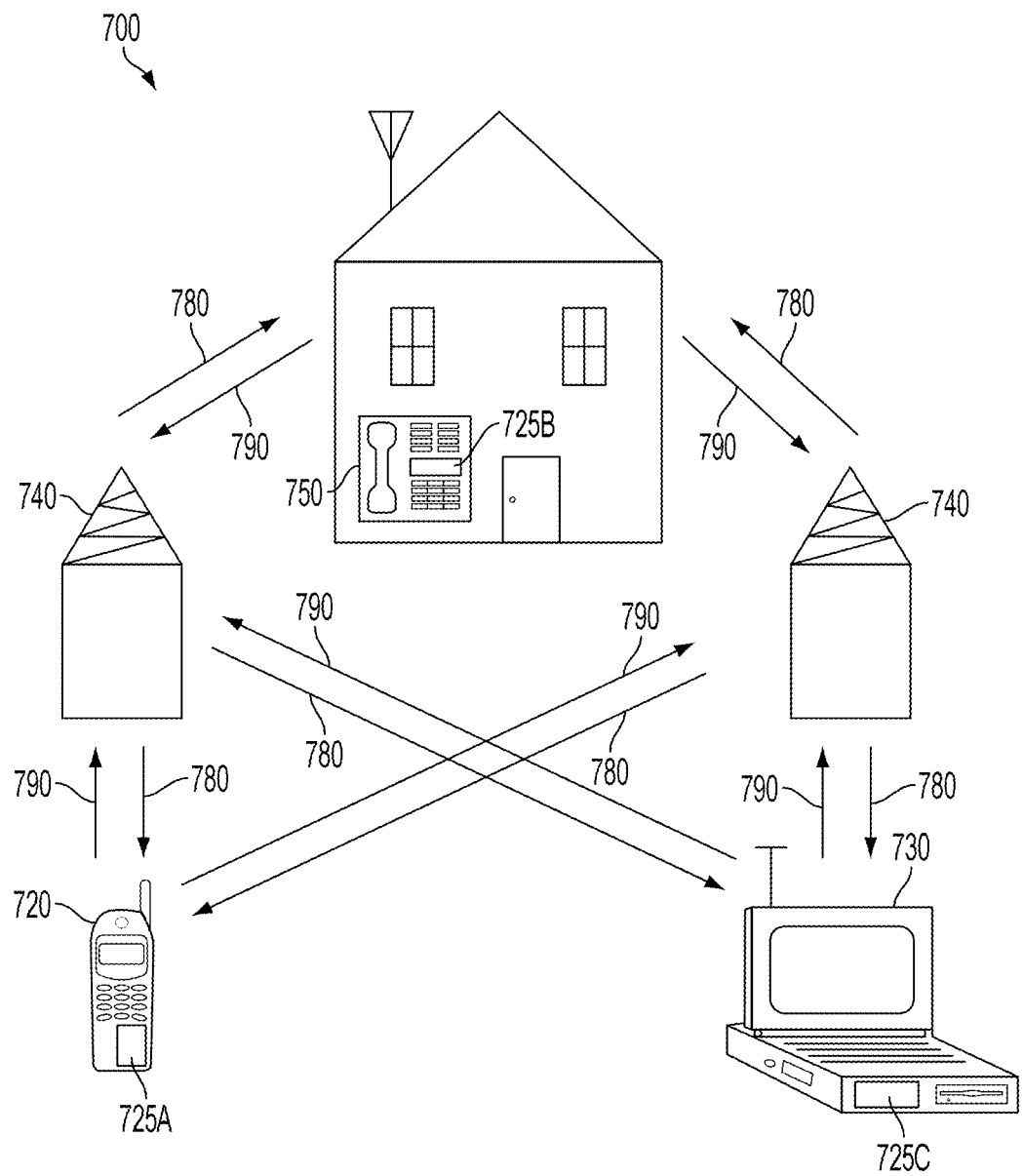
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed combined power amplifiers. It will be recognized that other devices may also include the disclosed combined power amplifiers, such as the base stations, switching devices, and network equipment. FIG. 7 shows forward link signals 780 from the base station 740 to the remote units 720, 730, and 750 and reverse link signals 790 from the remote units 720, 730, and 750 to base station 740.

In FIG. 7, remote unit 720 is shown as a mobile telephone, remote unit 730 is shown as a portable computer, and remote unit 750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed combined power amplifiers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A user equipment (UE), comprising:
   a first antenna;
   a second antenna;
   first switched combiner circuitry coupled to the first antenna via a radio frequency front end device, the radio frequency front end device comprising a first input to receive a first signal from the first switched combiner circuitry;
   second switched combiner circuitry coupled to the second antenna via the radio frequency front end device, the radio frequency front end device comprising a second input to receive a second signal from the second switched combiner circuitry, each of the first and second switched combiner circuitry operable to combine signals from a first transmit chain and a second transmit chain;
   a feedback receiver coupled to the first antenna and the second antenna via the radio frequency front end device, the feedback receiver coupled to an output of the radio frequency front end device and configured to receive an output of the combined signals from the first transmit chain and the second transmit chain;
   a first power amplifier selectively coupled to the first switched combiner circuitry and the second switched combiner circuitry and operable to amplify a signal from the first transmit chain;
   a second power amplifier selectively coupled to the first switched combiner circuitry and the second switched combiner circuitry, and operable to amplify the signal from the second transmit chain; and
   a modem coupled to the first transmit chain and the second transmit chain, the modem including a delay and a phase control logic circuit coupled to the feedback receiver, the delay and the phase control logic circuit operable to adjust a phase and a delay on at least one of the signals from the first transmit chain and second transmit chain to synchronize the signals.

2. The user equipment (UE) of claim 1, further comprising a controller operable to couple the second power amplifier to the first switched combiner circuitry for transmission of the combined signals to the first antenna at a high power level, the controller further operable to couple the second power amplifier to the second antenna for transmission of the signal from the second transmit chain to the second antenna at a low power level relative to the high power level.

3. The user equipment (UE) of claim 2, in which the low power level corresponds to a Class-3 power amplifier, and the high power level corresponds to a Class-2 power amplifier.

4. The user equipment (UE) of claim 2, further comprising a first local oscillator for the first transmit chain and a second local oscillator for the second transmit chain, a first frequency of the first local oscillator is different from a second frequency of the second local oscillator for transmission of the signal from the second transmit chain to the second antenna at the low power level.

5. The user equipment (UE) of claim 1, further comprising a correlation device configured to receive a feedback output signal, the correlation device configured to perform cross correlation to adjust the delay and the phase on at least one of the signals from the first transmit chain and second transmit chain.

6. The user equipment (UE) of claim 1, further comprising control logic circuitry operable to disable the first power amplifier when the second power amplifier is coupled to the second antenna.

7. The user equipment (UE) of claim 1, further comprising control logic circuitry operable to disable the second power amplifier when the first power amplifier is coupled to the first antenna.

8. The user equipment (UE) of claim 1, in which the first power amplifier is further selectively coupled to the first antenna and the second antenna.

9. The user equipment (UE) of claim 1, in which the second power amplifier is further selectively coupled to the first antenna and the second antenna.

10. The user equipment (UE) of claim 1, further comprising a local oscillator shared by the first transmit chain and the second transmit chain.

11. The user equipment (UE) of claim 1, further comprising a first local oscillator for the first transmit chain and a second local oscillator for the second transmit chain, a first frequency and a first phase of the first local oscillator is substantially the same as a second frequency and a second phase of the second local oscillator to combine the signals from the first transmit chain and the second transmit chain.

12. The user equipment (UE) of claim 1, in which the first switched combiner circuitry and the second switched combiner circuitry are further operable to coherently combine the signals from the first transmit chain and the second transmit chain.

13. A method of combining within a user equipment (UE), comprising:
combining, at a first switched combiner circuit or a second switched combiner circuit, amplified signals of a first transmit chain and a second transmit chain based at least in part on whether the first transmit chain and the second transmit chain are coupled to the first switched combiner circuit or the second switched combiner circuit, in which the amplified signals of the first transmit chain and the second transmit chain are received at a first power level;
transmitting a combined signal from the amplified signals of the first transmit chain and the second transmit chain over a first antenna or a second antenna at a second power level greater than the first power level based at least in part on whether the first transmit chain and the second transmit chain are coupled to the first switched combiner circuit or the second switched combiner circuit;
receiving a feedback signal; and
performing cross correlation to adjust a delay and a phase on at least one of the amplified signals from the first transmit chain and second transmit chain.

14. The method of claim 13, further comprising disabling a first power amplifier when a second power amplifier is coupled to the second antenna to transmit an amplified signal from the second transmit chain.

15. The method of claim 14, further comprising:
bypassing the first switched combiner circuit and the second switched combiner circuit to transmit the amplified signal from the second transmit chain at the first power level.

16. The method of claim 13, further comprising disabling a second power amplifier when a first power amplifier is coupled to the first antenna to transmit an amplified signal from the first transmit chain.

17. The method of claim 13, further comprising:
selectively coupling a first power amplifier to the first switched combiner circuit and the second switched combiner circuit; and
selectively coupling a second power amplifier to the first switched combiner circuit and the second switched combiner circuit.

18. The method of claim 17, further comprising:
coupling the first power amplifier and the second power amplifier to the first switched combiner circuit; and
combining the amplified signals of the first transmit chain and the second transmit chain to generate the combined signal at the second power level.

19. The method of claim 17, further comprising:
coupling the first power amplifier and the second power amplifier to the second switched combiner circuit; and
combining the amplified signals of the first transmit chain and the second transmit chain to generate the combined signal at the second power level.

20. The method of claim 13, further comprising:
coupling a first power amplifier to the first antenna; and
bypassing the first switched combiner circuit and the second switched combiner circuit when transmission at the first power level is expected.

21. The method of claim 13, further comprising:
coupling a second power amplifier to the second antenna; and
bypassing the first switched combiner circuit and the second switched combiner circuit to transmit an amplified signal from the second transmit chain at the first power level.

22. The method of claim 13, in which the combining comprises coherently combining and the combined signal comprises a coherently combined signal.

23. An apparatus for combining within a user equipment (UE), comprising:
a first antenna;
a second antenna;
first and second means for combining signals from a first transmit chain and a second transmit chain, the first combining means coupled to the first antenna via a radio frequency front end device and the second combining means coupled to the second antenna via the radio frequency front end device, the radio frequency front end device comprising a first input to receive a first signal from the first combining means, and a second input to receive a second signal from the second combining means;
a feedback receiver coupled to the first antenna and the second antenna via the radio frequency front end device, the feedback receiver coupled to an output of the radio frequency front end device and configured to receive an output of the combined signals from the first transmit chain and the second transmit chain;
means for amplifying a first signal from the first transmit chain, the first amplifying means selectively coupled to the first combining means and the second combining means;
means for amplifying a second signal from the second transmit chain, the second amplifying means selectively coupled to the first combining means and the second combining means; and
means for adjusting a phase and a delay on at least one of the signals from the first transmit chain and second transmit chain to synchronize the signals, the means for adjusting coupled to the feedback receiver.

24. The apparatus of claim 23, in which the first and second means are for coherently combining the signals from the first transmit chain and the second transmit chain.

25. A non-transitory computer-readable storage medium having non-transitory program code recorded thereon, the program code comprising:
program code to combine, at a first switched combiner circuit or a second switched combiner circuit, amplified signals of a first transmit chain and a second transmit chain based at least in part on whether the first transmit chain and the second transmit chain are coupled to the first switched combiner circuit or the second switched combiner circuit, in which the amplified signals of the first transmit chain and the second transmit chain are received at a first power level;

program code to transmit a combined signal from the amplified signals of the first transmit chain and the second transmit chain over a first antenna or a second antenna at a second power level greater than the first power level based at least in part on whether the first transmit chain and the second transmit chain are coupled to the first switched combiner circuit or the second switched combiner circuit;

program code to receive a feedback signal; and program code to perform cross correlation to adjust a delay and a phase on at least one of the amplified signals from the first transmit chain and second transmit chain.

26. The non-transitory computer-readable storage medium of claim 25, in which the program code to combine comprises program code to coherently combine; and the program code to transmit comprises program code to transmit a coherently combined signal.

27. A user equipment (UE), comprising:

a first antenna;

a second antenna;

first switched combiner circuitry coupled to the first antenna;

second switched combiner circuitry coupled to the second antenna, each of the first and second switched combiner circuitry operable to combine signals from a first transmit chain and a second transmit chain;

a feedback receiver coupled to the first antenna and the second antenna;

a modem coupled to the first transmit chain and the second transmit chain, the modem including a delay and a phase control logic circuit coupled to the feedback receiver, the delay and the phase control logic circuit operable to adjust a phase and a delay on at least one of the signals from the first transmit chain and second transmit chain to synchronize the signals;

a first power amplifier selectively coupled to the first switched combiner circuitry and the second switched combiner circuitry and operable to amplify a signal from the first transmit chain; and a second power amplifier selectively coupled to the first switched combiner circuitry and the second switched combiner circuitry, and operable to amplify the signal from the second transmit chain.

* * * * *